US011025231B1

(12) United States Patent
Sun et al.

(10) Patent No.: US 11,025,231 B1
(45) Date of Patent: Jun. 1, 2021

(54) PROVIDING A PROGRAMMABLE INDUCTOR TO ENABLE WIDE TUNING RANGE

(71) Applicant: Silicon Laboratories Inc., Austin, TX (US)

(72) Inventors: Ruifeng Sun, Charlottesville, VA (US); Abdulkerim Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/850,215

(22) Filed: Apr. 16, 2020

(51) Int. Cl.
| | |
|---|---|
| *H03B 5/08* | (2006.01) |
| *H03B 5/12* | (2006.01) |
| *H03F 3/19* | (2006.01) |
| *H03F 3/45* | (2006.01) |
| *H03J 5/24* | (2006.01) |
| *H03H 11/04* | (2006.01) |

(52) U.S. Cl.
CPC ............ *H03J 5/244* (2013.01); *H03H 11/04* (2013.01)

(58) Field of Classification Search
None
See application file for complete search history.

(56) References Cited

U.S. PATENT DOCUMENTS

| | | | |
|---|---|---|---|
| 5,852,384 A | 12/1998 | Sakakura et al. | |
| 6,304,146 B1 | 10/2001 | Welland | |
| 7,265,623 B2* | 9/2007 | Bhattacharjee | H03F 1/42 330/254 |
| 9,276,547 B2* | 3/2016 | Wang | H03F 3/4508 |
| 2004/0183606 A1* | 9/2004 | Komurasaki | H03B 5/1847 331/117 R |
| 2007/0132524 A1* | 6/2007 | Kishino | H03B 5/1215 331/179 |
| 2012/0249270 A1 | 10/2012 | Li et al. | |
| 2012/0286889 A1* | 11/2012 | Park | H03B 5/1212 331/117 FE |
| 2020/0066126 A1 | 2/2020 | Voor et al. | |

OTHER PUBLICATIONS

WiSUN Alliance, "White Paper: Comparing IoT Networks at a Glance; How Wi-SUN FAN stacks up against LoRaWAN and NB-IoT," 2019, 12 pages total.
U.S. Appl. No. 16/211,513, filed Dec. 6, 2018, entitled "System, Apparatus and Method for Optimizing Configuration of a Wireless Transmitter," by Hadrien Hoyer.

* cited by examiner

*Primary Examiner* — Kenneth B Wells
(74) *Attorney, Agent, or Firm* — Trop, Pruner & Hu, P.C.

(57) ABSTRACT

In one embodiment, a tuning network includes: a controllable capacitance; a first switch coupled between the controllable capacitance and a reference voltage node; a second switch coupled between the controllable capacitance and a third switch; the third switch coupled between the second switch and a second voltage node; a fourth switch coupled between the second voltage node and a first inductor; the first inductor having a first terminal coupled to the fourth switch and a second terminal coupled to at least the second switch; and a second inductor having a first terminal coupled to the second terminal of the first inductor and a second terminal coupled to the controllable capacitance.

18 Claims, 10 Drawing Sheets

PROVIDING A PROGRAMMABLE INDUCTOR TO ENABLE WIDE TUNING RANGE

BACKGROUND

An inductor-capacitor (LC) tank or network is commonly employed as a loading component in radio frequency (RF) circuits such as amplifiers, filters, mixers and so forth to provide sufficient gain and filtering at high frequency. Conventionally, a fixed-value inductor is used along with a variable capacitor (or a programmable capacitor array), so that the operating frequency can be tuned.

However, there are several design constraints that come into play when designing a network for use over a wide frequency range, particularly when seeking to balance countervailing considerations including circuit size, power consumption, component quality and so forth. Available solutions suffer from drawbacks in these different criteria, which lead to design tradeoffs and corresponding limits on size, performance, power consumption and cost.

SUMMARY OF THE INVENTION

According to one aspect, an integrated circuit include a tuning network. The tuning network in turn may include: a controllable capacitance; a first switch coupled between the controllable capacitance and a reference voltage node; a second switch coupled between the controllable capacitance and a third switch; the third switch coupled between the second switch and a second voltage node; a fourth switch coupled between the second voltage node and a first inductor; the first inductor having a first terminal coupled to the fourth switch and a second terminal coupled to at least the second switch; and a second inductor having a first terminal coupled to the second terminal of the first inductor and a second terminal coupled to the controllable capacitance.

In an example, the integrated circuit further comprises a control circuit to selectively control the first switch, the second switch, the third switch and the fourth switch to cause the tuning network to operate at a desired resonant frequency. The control circuit may control the tuning network to: operate in a first sub-range of a frequency range, via a parallel coupling of the second inductor to the controllable capacitance and a decoupling of the first inductor; and operate in a second sub-range of the frequency range, via a parallel coupling of the first inductor, the second inductor and the controllable capacitance. The second sub-range may be a second frequency sub-band between a minimum frequency and a first maximum frequency and the first sub-range may be a first frequency sub-band between a second minimum frequency greater than the minimum frequency and a maximum frequency.

In an example, the integrated circuit further comprises a programmable resistor coupled to the tuning network. The programmable resistor may reduce an impedance variation of the tuning network over a frequency range. The first inductor may be formed on a first conductive layer of a semiconductor die and the second inductor is formed on a second conductive layer of the semiconductor die, where the first inductor is coupled to the second inductor through at least one via layer. The integrated circuit may further comprise a mixer coupled to the tuning network, where the tuning network comprises a load circuit for the mixer. In another aspect, an apparatus comprises: a programmable capacitance; a programmable inductance coupled to the programmable capacitance; a first switch to couple a maximum value of the programmable inductance to the programmable capacitance in a first mode of operation in a first sub-frequency band extending from a minimum frequency of a total frequency range to a first maximum frequency less than a maximum frequency of the total frequency range; and a second switch to couple a lesser value of the programmable inductance to the programmable capacitance in a second mode of operation in a second sub-frequency band extending to the maximum frequency of the total frequency range.

In an example, the programmable inductance comprises a first inductor and a second inductor coupled to the first inductor. In the second mode of operation, the programmable capacitance is coupled in parallel with the first inductor. In the first mode of operation, the programmable capacitance is coupled in parallel with the first inductor and the second inductor. The apparatus may further include: a third switch coupled between the controllable capacitance and a reference voltage node; and a fourth switch coupled between the controllable capacitance and the second switch. Further, the apparatus may include a control circuit to selectively control the first switch, the second switch, the third switch and the fourth switch to cause the apparatus to operate at a desired resonant frequency. The control circuit: in the first mode of operation, is to control the first switch and the third switch to couple the maximum value of the programmable inductance in parallel with the programmable capacitance; and in the second mode of operation, is to control the second switch and the fourth switch to couple the lesser value of the programmable inductance in parallel with the programmable capacitance. In the second mode of operation, an on resistance of the second switch is outside of a resonant tank formed of the programmable capacitance and the programmable inductance. A quality factor of the maximum value of the programmable inductance may exceed a quality factor of the first inductor and a quality factor of the second inductor.

In yet another aspect, a method includes: receiving, in a radio device, a desired channel indication at which the radio is to operate; determining a sub-band of operation in which the desired channel is located, the sub-band having a frequency range less than a total frequency range of the radio device; responsive to determining the sub-band of operation is a first sub-band of operation extending from a minimum frequency of the total frequency range to a first maximum frequency less than a maximum frequency of the total frequency range, coupling, via at least a first switch and a second switch, a maximum value of a programmable inductance to a programmable capacitance to form a resonant tank circuit; and providing the resonant tank circuit as a load for at least one radio frequency circuit, the resonant tank circuit having a resonant frequency within the first sub-band of operation.

In an example, the method further comprises: responsive to determining the sub-band of operation is a second sub-band of operation extending to the maximum frequency of the total frequency range, coupling, via at least the first switch and the second switch, a lesser value of the programmable inductance to the programmable capacitance to form the resonant tank circuit; and providing the resonant tank circuit as the load for the at least one radio frequency circuit, the resonant tank circuit having a resonant frequency within the second sub-band of operation.

Coupling the maximum inductance to the programmable capacitance comprises selectively controlling: the first switch coupled between the programmable inductance and a first voltage node; the second switch coupled between the first voltage node and a third switch; the third switch coupled between the second switch and the programmable capacitance; and a fourth switch coupled between the programmable capacitance and a reference voltage node, to cause the resonant tank circuit to operate having the resonant frequency.

DETAILED DESCRIPTION

In various embodiments, a resonant tank circuit is provided that includes both a programmable capacitor and a programmable inductor. By using a programmable inductor, a wide frequency range of operation may be covered, while at the same time not consuming too much chip area and system current/power. Still further as described herein, in different implementations the amount of tuning capacitance can be reduced, and an effective impedance of the resonant tank circuit may have less variation over the frequency range.

Figure 1:
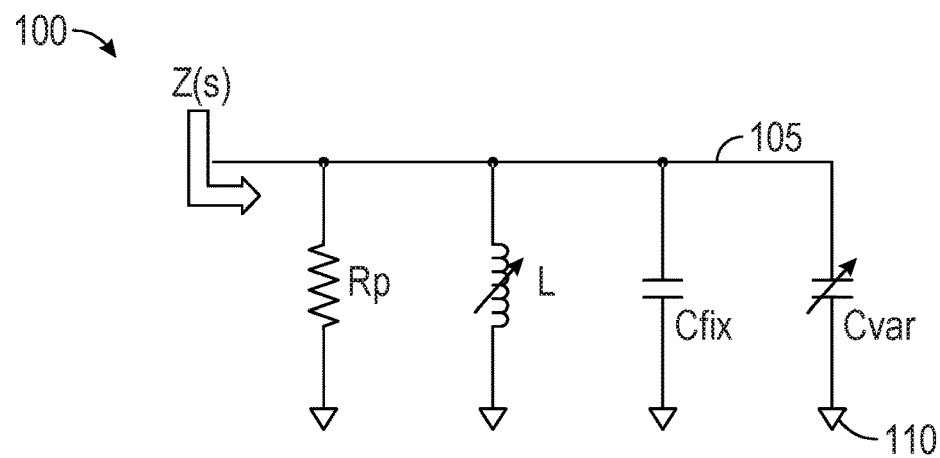
FIG. 1 is a high level schematic diagram of a resonant tank circuit in accordance with an embodiment.

Referring now to FIG. 1, shown is a high level schematic diagram of a resonant tank circuit (also referred to as a tuning network) in accordance with an embodiment. As shown in FIG. 1, resonant tank circuit 100 includes a plurality of components in the embodiment shown, these components couple between a signal line 105 and a reference voltage node 110. In different embodiments, note that signal line 105 may couple to an output (or an input) of a given circuit such that resonant tank circuit 100 may act as a load circuit for the given circuit. In different embodiments, reference voltage node 110 may couple to an actual ground voltage. In other embodiment implementations, reference voltage node 110 may couple to an AC ground. Node 110 may couple to a physical ground or a supply node (which may include a biasing voltage) in different implementations.

As illustrated in FIG. 1, inductor L is implemented as a programmable inductor. Various implementations of a programmable inductor are described herein. For ease of introduction, in one embodiment programmable inductor L may be implemented as a plurality of separate inductors, e.g., formed on a single semiconductor die along with the additional circuitry shown in FIG. 1. As further illustrated, resonant tank circuit 100 further includes a fixed capacitance Cfix, which represents the fixed amount of capacitance in circuit 100. In different implementations, this parasitic capacitance may come from device parasitics and/or routing/interconnect parasitics.

As further illustrated in FIG. 1, resonant tank circuit 100 also includes a programmable capacitor Cvar, which may be used along with programmable inductor L to tune the operating frequency. As further illustrated, resonant tank circuit 100 also includes a resistor Rp, which represents the resistive part of the tank impedance, and may be a lumped sum of the resistive loss caused by the finite quality factor (Q) of the inductor and the capacitors, and/or a dedicated/explicit resistor. In the high level of FIG. 1, the only actual physical components of resonant tank circuit 100 may be programmable inductor L and programmable capacitor Cvar, with the other components realized by way of parasitics inherent in physical circuitry. Of course in other cases, additional intentional capacitances and resistances may be provided. Furthermore, while in the embodiment of FIG. 1 all components are shown as being coupled in parallel with each other between signal line 105 and reference voltage node 110, in other cases at least portions of the circuitry may connect serially as described herein, in certain modes of operation.

With a resonant tank circuit such as shown in FIG. 1, a resonant frequency can be calculated by:

$$f_c = \frac{1}{2\pi\sqrt{L(C_{var} + C_{fix})}}$$

The tuning range, i.e., maximum and minimum resonant frequencies (fcmax, fcmin), can be calculated by:

$$f_{c,min} = \frac{1}{2\pi\sqrt{L(C_{var,max} + C_{fix})}} \text{ and }$$

$$f_{c,max} = \frac{1}{2\pi\sqrt{L(C_{var,min} + C_{fix})}}$$

Where Cvar,min and Cvar,max are the minimum and the maximum capacitance of the variable capacitor, respectively.

The impedance at the resonant frequency is:

$|Z| = R_p \approx Q \cdot \omega_c \cdot L = Q \cdot (2\pi f_c) \cdot L$, at resonance $f = f_c$ where Q is the quality factor of the LC tank (network).

Embodiments provide for an improved resonant tank circuit that can operate over wide frequency ranges with minimal chip real estate and reduced power consumption. In contrast, conventional LC tanks suffer from the following drawbacks due to a variety of design tradeoffs: (1) inductance (L) is determined by a maximum operating frequency (Fmax) and minimum fixed capacitance (Cfix) in which the higher the Fmax and the Cfix, the lower the L; (2) the minimum impedance (Zmin) at resonance provided by the LC tank is determined by the minimum operating frequency (Fmin), the L, and the quality factor (Q) of the tank, and the lower the Fmin and the L, the higher the Q for same Zmin; (3) the amount of the variable capacitance (Cvar) is determined by Fmin and L, where the lower the Fmin and the L, the larger the Cvar. As a result, a conventional LC tank that operates over a wide frequency range has a number of design tradeoffs. Specifically, to be able to reach Fmax, a low L is needed. However, to meet Zmin requirement at Fmin, Q has to be large enough. Both inductor and capacitor Q's are related to chip area and overall system current/power consumption; Cvar has to be large enough to be able to tune to Fmin. This will demand large area (to attain both capacitance and Q), and bring in more parasitics and thus increase Cfix, which will in turn demand a smaller L causing a dilemma. Further, due to frequency dependence of both Q and Z, the tank impedance (Z) tends to have excessively large variation over the wide frequency range.

With embodiments, benefits may be realized by providing a programmable inductor in which different amounts of inductance may be switched into the resonant tank circuit depending upon a desired frequency of operation. For example, an integrated circuit such as a transceiver, receiver and/or transmitter may operate at multiple frequencies according to multiple communication protocols. Each such protocol may direct the operation to be within a particular frequency range. And in many instances, a given band of operation may further be subdivided into different frequency bands each for a given channel of communication. By providing a programmable inductor, a full frequency range of operation of a device can be broken up into 2 or more frequency bands, where each frequency band is a sub-band representing a portion of the total frequency range of operation.

At a high level as an example, assume that a full frequency range of operation extends from a minimum frequency Fmin to a maximum frequency Fmax. While embodiments are not limited in this regard, in one particular implementation a total frequency range may extend from approximately 400 megahertz (MHz) to approximately 1 gigahertz (GHz). Of course much larger frequency ranges are possible in other implementations.

In a particular implementation, this frequency range may be split up into at least two separate bands. More specifically, the frequency range may be split into 2 sub-bands, referred to herein as a lower frequency band (LB) and a higher frequency band (HB). These 2 frequency bands may be represented as follows with respect to the entire frequency range of fmin to fmax:

$$[f_{min}, f_{max}] \leftrightarrow \{([f_{min}, f_{max1}], [f_{min2}, f_{max}]\}$$

Note that "fmax1" can be equal to (or larger than) "fmin2" if all frequencies within fmin and fmax are desired to be covered, or smaller if one (or more) gaps are permitted. With these two sub-bands, "HB" represents the higher frequency band, i.e., [fmin2,fmax], and "LB" represents the lower frequency band, i.e., [fmin, fmax1].

Figure 2:
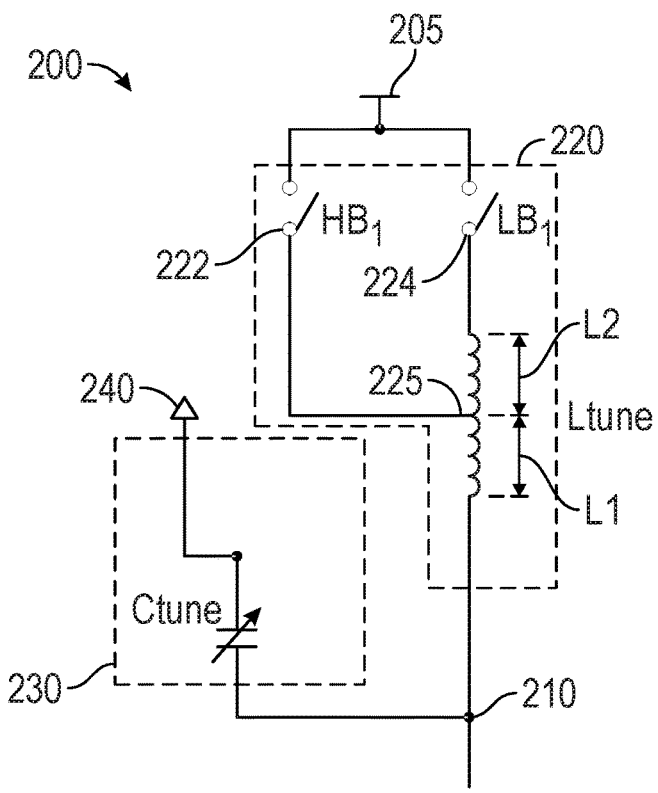
FIG. 2 is a schematic diagram of a resonant tank circuit in accordance with one embodiment.

Referring now to FIG. 2, shown is a schematic diagram of a resonant tank circuit in accordance with one embodiment. In FIG. 2, a resonant tank circuit 200 can be used in an implementation in which a full frequency range is separated into 2 frequency bands, namely a lower frequency band LB and a higher frequency band HB. To realize operation in these different bands, different amounts of inductance provided by way of separate inductors L1 and L2, which collectively form a programmable inductor, may be controllably coupled into resonant tank circuit 200. Details of the arrangement are described further below.

As illustrated, resonant tank circuit 200 may couple between a first node 205 and a second node 210. In the embodiment shown, node 205 may be a supply voltage node that is coupled to receive a supply voltage and node 210 may be a circuit connection node to which a given circuit may couple such that resonant tank circuit 200 acts as a load circuit for this given circuit. As one particular example, a given circuit (not shown for ease of illustration in FIG. 2) may be a mixer, e.g., implemented in part using a transconductance amplifier.

In any case, resonant tank circuit 200 includes a programmable inductor portion 220 and a programmable capacitor portion 230. In the embodiment shown, programmable inductor portion 220 includes a pair of inductors L1 and L2 coupled together in series at an inter-inductor node 225. In addition, programmable inductor portion 220 includes a pair of switches 222, 224. In various embodiments, switches 222, 224 may be implemented as metal oxide semiconductor field effect transistors such as n-channel MOSFETs (NMOS) or p-channel MOSFETs (PMOS). As shown in the illustration of FIG. 2, each of these switches is associated with a given one of the frequency sub-bands. In particular, switch 222 may be controlled to be closed when operation is desired in the HB frequency band (and switch 224 may be controlled to be opened in this operation mode). In contrast, switch 222 may be controlled to be opened when operation is desired in the LB frequency band (and switch 224 may be controlled to be closed in this operation mode).

As shown, programmable capacitor portion 230 includes a tuning capacitor Ctune, which may be formed in an embodiment as a plurality of individual controllable capacitances, e.g., implemented as a varactor or other programmable capacitance. As illustrated, programmable capacitor portion 230 couples between circuit connection node 210 and a reference voltage node 240, e.g., a ground node. Although shown with this implementation in the embodiment of FIG. 2, in another implementation, the second terminal of tuning capacitor Ctune may couple to switch 222, instead of reference voltage node 240.

As an example, the tuning capacitor may be implemented as a plurality of individual capacitors, e.g., coupled in parallel, with each individual capacitor associated with a corresponding switch such that based on programmable control each individual capacitor may be selectively switched into or out of the tuning capacitor array. In different implementations, the individual capacitors of the capacitor array may be formed of equally-valued capacitors or they may be formed of differently-valued capacitors, e.g., binary weighted, thermometer weighted, radix weighted or so forth.

In HB operation mode, a lower inductance is preferred, so switch 222 ("HB1") is closed, while switch 224 ("LB1") is open. As a result, the total effective inductance of the programmable inductor is simply "L1", which has a smaller value.

$$L_{tot,HB} = L_1$$

Note that L1 is usually determined by fmax (and Cfix not shown here, but shown in FIG. 1), similar to a conventional LC tuning network. In contrast, in LB operation mode, a higher inductance is preferred, so switch 224 ("LB1") is closed, while switch 222 ("HB1") is open. Consequently, the total effective inductance is determined by:

$$L_{tot,LB} = L_1 + L_2 + 2 \times k_{12} \times \sqrt{L_1 \cdot L_2}$$

where L1 and L2 are self-inductances of the two segments of the programmable inductor, and $k_{12}$ is the mutual coupling coefficient between L1 and L2. This arrangement not only increases the total effective inductance (more than simply L1+L2), but it also boosts the quality factor (Q), because the total series resistance is:

$$R_{s,tot,LB} = R_{s1} + R_{s2}$$

where Rs1 is the series resistance of inductor L1 and Rs2 is the series resistance of inductor L2.

And the Q is given by:

$$Q_{tot,LB} = \frac{\omega \cdot L_{tot,LB}}{R_{s,tot,LB}} > Q_1 \text{ or } Q_2$$

where Q of each segment is $$Q_1 = \frac{\omega \cdot L_1}{R_{s1}} \text{ or } Q_2 = \frac{\omega \cdot L_2}{R_{s2}}$$

Both effects may substantially increase the effective impedance at resonance at lower frequency:

$$|Z|_{fmin} \approx Q_{tot,LB} \cdot (2\pi f_{min}) \cdot L_{tot,LB} >> Q_1 \cdot (2\pi f_{min}) \cdot L_1$$

This effect with an increased effective impedance and higher Q greatly relaxes constraints imposed on a conventional LC network to attain an impedance target over a wide frequency range. In a conventional LC network, because the maximum inductance is limited by the maximum frequency, the only way to improve minimum impedance (Zmin (at Fmin)) is to obtain a high enough Q at Fmin. But since Q is directly related to chip area for both inductor and capacitor, a correspondingly larger chip area is needed in a conventional design. In embodiments having a programmable inductor, not only is L higher at lower frequency to improve impedance, but also Q is boosted. As a result, a smaller area is sufficient for a given Zmin requirement.

At the same time, the variation of the impedance is smaller over a given frequency range, as compared to a conventional LC network. To see this, assume a conventional LC tank Q is limited by the inductor, as usually this is the case. Here, tank impedance at resonance given by:

$$|Z| = R_p \cong Q \cdot \omega_c \cdot L \cong Q_L \cdot \omega_c \cdot L \cong \frac{\omega_c \cdot L_s}{R_{sL}} \cdot \omega_c \cdot L_s = \frac{L_s^2}{R_{sL}} \cdot (2\pi f_c)^2,$$

at resonance $f = f_c$ where Ls and RsL are inductance and resistance of an inductor represented by a series LR model. For a conventional LC network, Z variation over [fmin, fmax] is given by:

$$\frac{|Z|_{max}}{|Z|_{min}} = \left(\frac{f_{max}}{f_{min}}\right)^2$$

For a resonant tank circuit in accordance with an embodiment having a programmable inductor, Z variation in each sub-band is given by:

$$\left(\frac{|Z|_{max}}{|Z|_{min}}\right)_{HB} = \left(\frac{f_{max}}{f_{min2}}\right)^2 \text{ and } \left(\frac{|Z|_{max}}{|Z|_{min}}\right)_{LB} = \left(\frac{f_{max1}}{f_{min}}\right)^2$$

Both values are smaller than that of a conventional resonant tank, because fmin2>fmin, and fmax1<fmax. As an example, assume, $$f_{max} = 2 \times f_{min}$$

$$f_{max1} = f_{min2} = \sqrt{2} \times f_{min}$$

In this case, for the conventional solution, |Z| variation is 4× or 12 dB. In contrast with an embodiment having a programmable inductor, impedance variation is only 2× or 6 dB in each sub-band. In reality, because both inductor Q and tank Q are not a linear function of the frequency (due to higher order effects and more pronounced contribution of the capacitor portion), the actual variation may not be as large as 12 dB over a 2× frequency range for a conventional LC network.

In addition to this smaller variation in the sub-band, because the effective impedance in the lower band is boosted as discussed previously, the overall variation of the impedance over the entire frequency range [fmin, fmax], also is smaller. Both of these points are graphically illustrated in FIG. 3.

Figure 3:
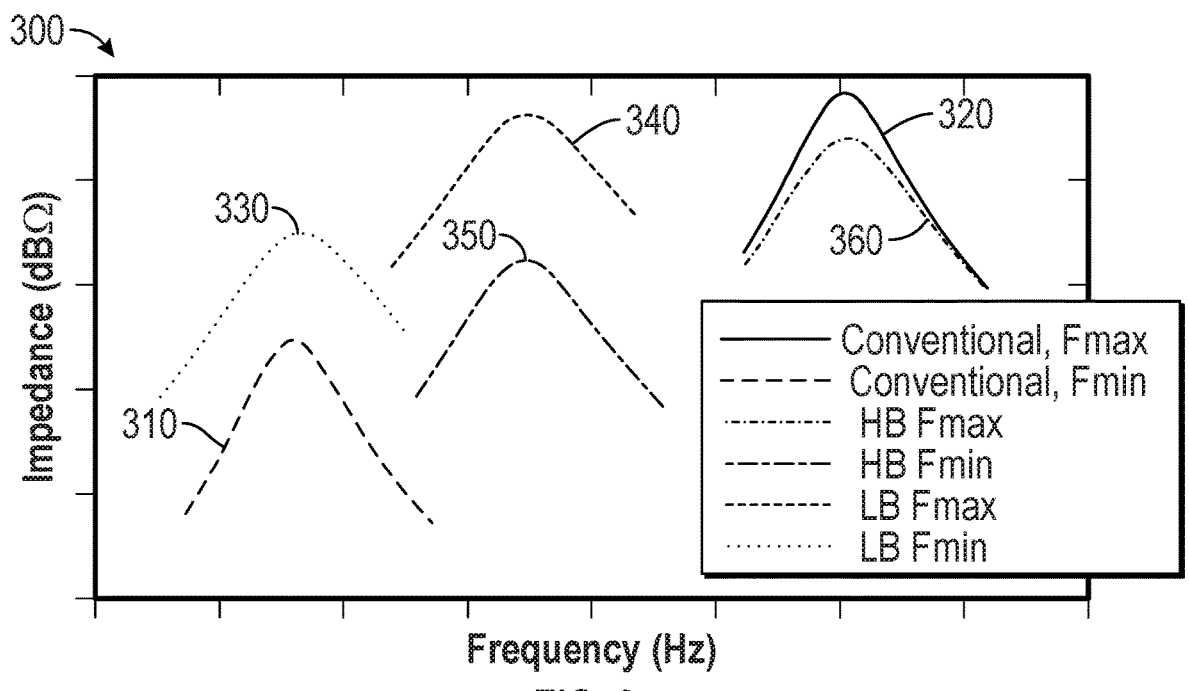
FIG. 3 is a graphical illustration of variation in impedance over frequency in accordance with one embodiment.

Referring now to FIG. 3, shown is a graphical illustration of variation in impedance over frequency. As shown in graph 300, for a conventional LC tank that operates between a minimum frequency Fmin and a maximum frequency Fmax, a large variation in impedance exists. Specifically as shown, at minimum frequency, an impedance curve 310 has a much smaller impedance than an impedance curve 320 at a maximum frequency. Instead with an embodiment, reduced impedance variation across sub-frequency ranges is realized. Thus as illustrated further in FIG. 3, in a LB mode of operation, a variation between a minimum frequency and a maximum frequency is illustrated in impedance curves 330 and 340. Similarly, in a HB mode of operation, a variation between a minimum frequency and a maximum frequency is illustrated in impedance curves 350 and 360. As seen, a much smaller impedance variation exists using an embodiment.

Figure 4A:
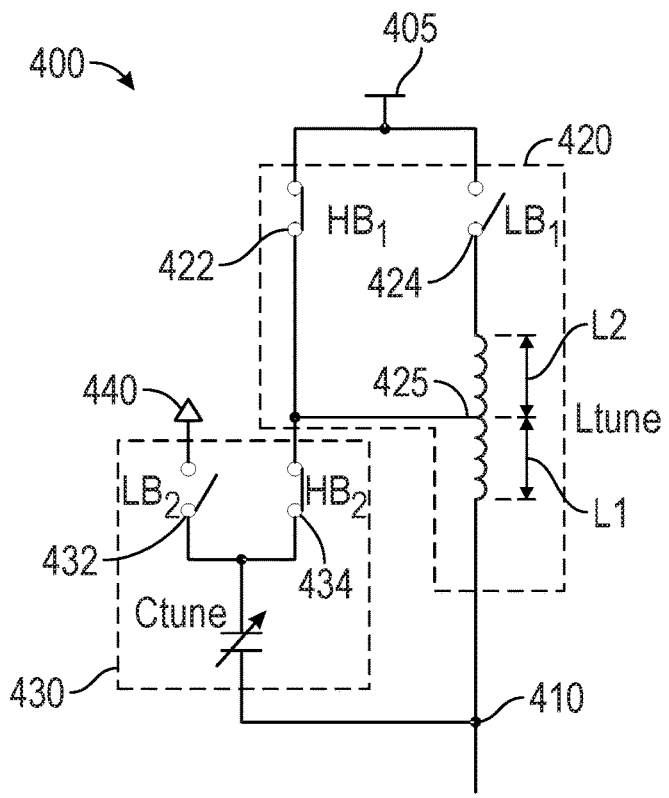
FIG. 4A is a schematic diagram of a resonant tank circuit in accordance with another embodiment.

As detailed above with regard to FIG. 2, a resonant tank circuit having a programmable inductance may be controlled using switches associated with a programmable inductor portion of the circuit. In some embodiments, improved performance may be realized by further including one or more switches associated with a programmable capacitance portion of the resonant tank circuit. Referring now to FIG. 4A, shown is a schematic diagram of a resonant tank circuit in accordance with another embodiment. In general, resonant tank circuit 400 may be implemented similarly to resonant tank circuit 200 of FIG. 2 (and thus many components include the same numerals, albeit of the "400" series). Thus in large aspect, the configuration and operation of resonant tank circuit 400 may be similar to that discussed above and will be not discussed in detail here.

However, note that in programmable capacitance portion 430, multiple switches 432 and 434 are included. As seen, switch 432 couples between a given terminal of tuning capacitor Ctune and a reference voltage node 440. An additional switch 434 couples between this terminal of tuning capacitor Ctune and switch 422 (and also couples to inter-inductor node 425).

FIG. 4A shows an implementation for HB operation in which switch 434 is closed and switch 432 is opened. With this configuration, the LC tank of resonant tank circuit 400 is implemented as a parallel coupling of tuning capacitor Ctune and first inductor L1 of programmable inductor Ltune. An equivalent circuit for this arrangement is shown in FIG. 4C (switches and other circuitry are not shown for ease of illustration). While in FIG. 4A, switches 432, 434 are shown explicitly for clarity in some implementations, rather than providing these physical switches, corresponding switches present within tuning capacitor Ctune instead may be used to effect the same switching strategy.

Figure 4B:
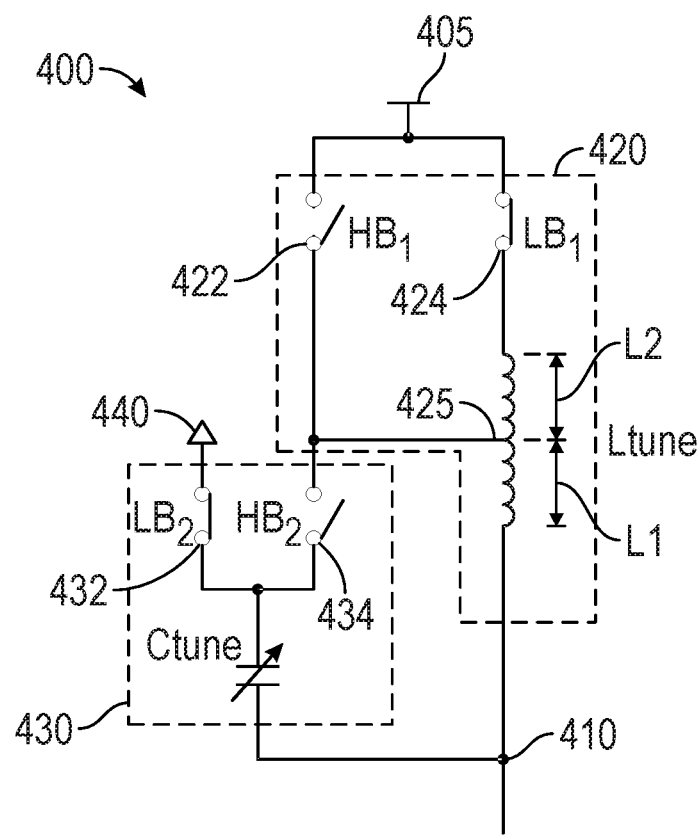
FIG. 4B is a schematic diagram of a resonant tank circuit in accordance with another embodiment.
Figure 4C:
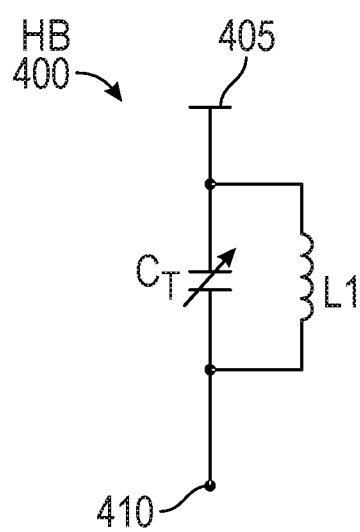
FIG. 4C is an equivalent circuit for the resonant tank circuit of FIG. 4A.
Figure 4D:
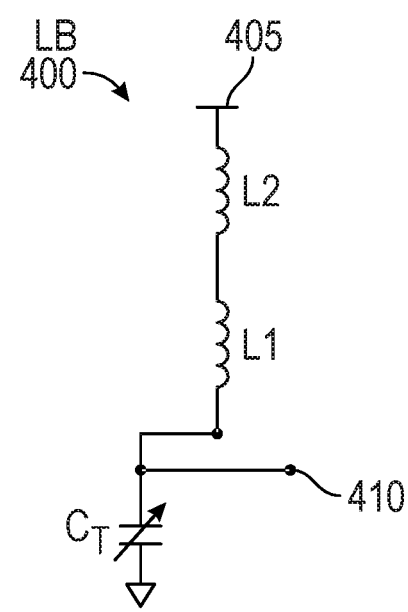
FIG. 4D is an equivalent circuit for the resonant tank circuit of FIG. 4B.

FIG. 4B shows an implementation for LB operation in which switch 434 is opened and switch 432 is closed. With this configuration, the LC tank of resonant tank circuit 400 is implemented as a parallel coupling of tuning capacitor Ctune and first and second inductors L1, L2 of programmable inductor Ltune. An equivalent circuit for this arrangement is shown in FIG. 4D (switches and other circuitry are not shown for ease of illustration). As discussed above, although FIG. 4B explicitly shows switches 432, 434 for clarity in some implementations, rather than providing these physical switches, corresponding switches present within tuning capacitor Ctune instead may be used to effect the same switching strategy.

In FIGS. 4A and 4B, the variable capacitor "Ctune" is implemented in a special way to reduce the adverse impact of having a switch in series with an inductor in the programmable inductor, especially for HB operation. When a programming switch (i.e., 422 "HB1" or 424 "LB1") is ON, it introduces an extra resistance in series with the inductor, which will degrade the Q. Although this is more tolerable for LB operation, because the intrinsic series resistance is already large, it can be more detrimental for HB operation. While an implementation may reduce the switch ON resistance by increasing the switch size, doing so may incur a large chip area. Instead, with an embodiment as in FIG. 4A in HB mode, two terminals of "Ctune" are connected to two terminals of inductor "L1". As such with this configuration, inductor L1 and tunable capacitor Ctune couple in parallel.

In this way, ON resistance for switch 422 ("HB1") is outside the LC tank, and it only adds to the total tank impedance at resonance, "Rp", which has a much larger value. Ideally, this same coupling of switches may occur when operation is in the lower frequency range. However, because it is more tolerable, programmable capacitor Ctune is connected to reference voltage node 440 by the closing of switch 432 ("LB2"). With this configuration, switch 432 may be implemented using an NMOS transistor to save some chip area and reduce parasitic capacitance. All other switches shown in FIGS. 4A and 4B may be implemented using PMOS transistors.

Note FIGS. 4A and 4B show an implementation in which the LC network is coupled between supply and signal nodes (405, 410, respectively). However a complementary implementation, where LC network 400 is coupled between ground and signal nodes, is also feasible. In that case, the switches can be implemented with complementary device types, e.g., NMOS devices instead of PMOS devices.

Thus by providing separate switches 432 and 434 and configuring them as shown in FIGS. 4A and 4B, the adverse impact of switch 422 in HB operation is reduced, thus improving the overall performance of resonant tank circuit 400 in HB operation. If this additional switch 434 HB2 is not present (i.e., the tuning capacitor is not connected to L1 as shown in FIGS. 4A and 4B), and instead the tuning capacitor is coupled to an AC ground as in FIG. 2, when in HB mode, switch 422 HB1's ON resistance (let's call it Rsw_HB1) will directly add to the total resistance in series with L1, which also includes L1's own resistance (let's call it Rs_L1).

In this case, without consuming an excessive amount of chip area to build a large switch, Rsw_HB1 will be similar to Rs_L1. For example, if Rsw_HB1=Rs_L1, then Q of L1 (let's call it QL1) is cut in half, and because the effective load impedance provided by L1 is given by: ZL1~QL1*w*L1, so it will be reduced by half if QL1 becomes half, which, when translated into gain of an amplifier, will be 6 dB less. With switch 434 closed in HB mode, then switch 422 is outside the parallel LC tank formed by L1 and the tuning capacitance. The total impedance in HB mode is Z_LC_tank+Rsw_HB1, and Z_LC_tank is the impedance of LC tank of L1+Ctune. And in fact, there exists a little more impedance on top of the impedance of LC tank.

Figure 4E:
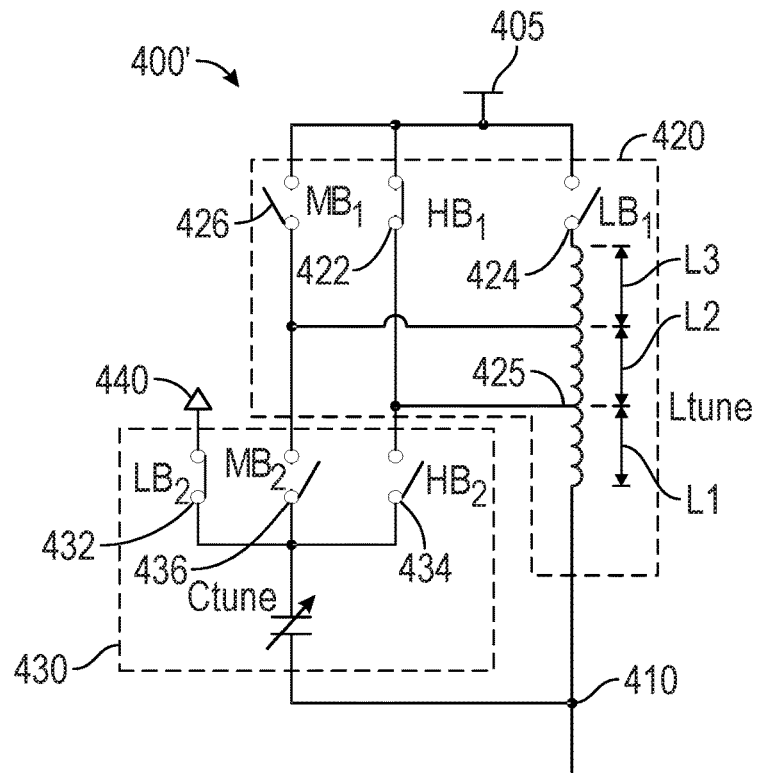
FIG. 4E is a schematic diagram of a resonant tank circuit in accordance with another embodiment.

As discussed above, in other cases, there may be more than two separate inductors that form a programmable inductor. In such cases, a larger frequency range can be broken into a plurality of sub-bands, where each inductor (alone or in combination with other inductors) is associated with a particular sub-band. And to effect this strategy, there may be a corresponding switch associated with each inductor. Referring now to FIG. 4E, shown is a schematic diagram of a resonant tank circuit in accordance with yet another embodiment. As shown in FIG. 4E, resonant tank circuit 400 may be implemented with 3 inductors that form programmable inductor Ltune, namely inductors L1-L3. As seen, to effect control of this additional inductor, another switch 426 is provided. Similarly, an additional switch 436 may be provided within programmable capacitor portion 430. With this arrangement, a larger frequency range may be segmented into 3 sub-bands. For a lowest sub-band all 3 inductors L1-L3 may be coupled into the LC tank by appropriate control of switches. In turn for a middle sub-band, inductors L1 and L2 may be coupled into the LC tank by appropriate control of switches. Finally, for a highest sub-band, only inductor L1 may be coupled into the LC tank by appropriate control of switches.

If it is desired to reduce the variation in each sub-band further for a particular implementation, a tunable/programmable resistor in parallel with the tunable LC network can be added to the resonant tank circuit.

Figure 5:
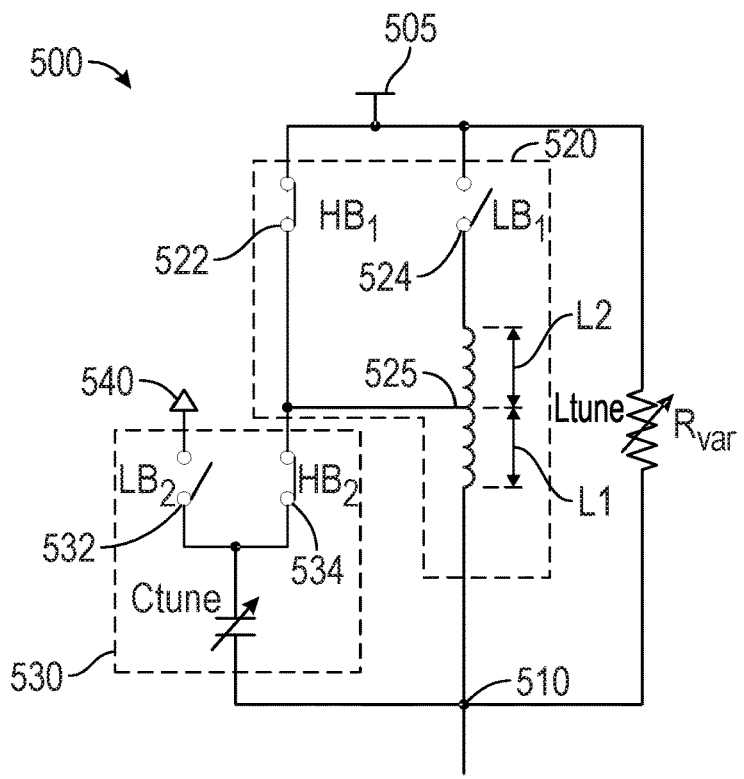
FIG. 5 is a schematic diagram of a resonant tank circuit in accordance with yet another embodiment.

Referring now to FIG. 5, shown is a schematic diagram of a resonant tank circuit 500 in accordance with yet another embodiment. As shown in FIG. 5, resonant tank circuit 500 may be substantially implemented as with resonant tank circuit 400 as an example (and thus many components include the same numerals, albeit of the "500" series). However, note the presence in resonant tank circuit 500 of a programmable resistance Rvar coupled in parallel between a first voltage node 505 and a circuit connection node 510. In a given implementation, this programmable resistance Rvar can be implemented as an array of resistors coupled in parallel, with each resistor associated with a corresponding switch such that it may be controllably coupled into or out of the resistor array. As an example, the programmable resistor may be implemented as a plurality of individual resistors, e.g., coupled in parallel, with each individual resistor associated with a corresponding switch such that based on programmable control each individual resistor may be selectively switched into or out of the tuning resistor array.

With an embodiment as in FIG. 5, the total impedance is given by $$|Z| = R_p \| R_{var} \cong \left[\frac{L_s^2}{R_{sL}} \cdot (2\pi f_c)^2\right] \| R_{var}, \text{ at resonance } f = f_c$$

As frequency increases and Rp become higher, Rvar can be tuned to a smaller value to make the total Z relatively constant.

Figure 6:
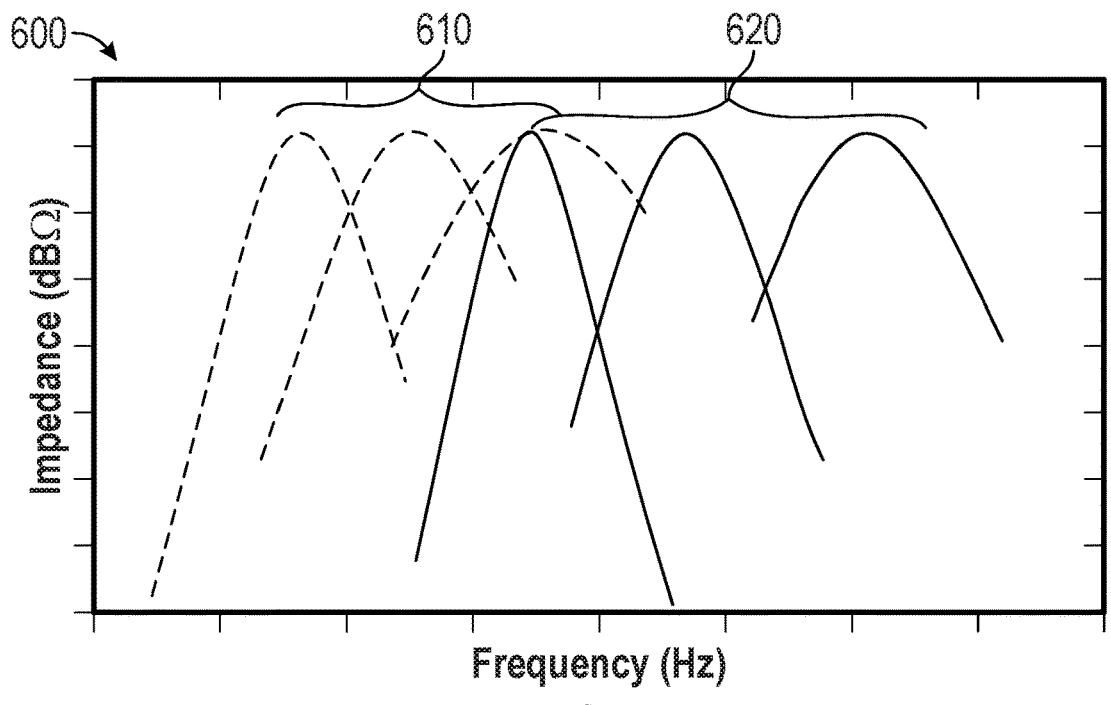
FIG. 6 is a graphical illustration of impedance versus frequency for a resonant tank circuit in accordance with an embodiment.

Referring now to FIG. 6, shown is a graphical illustration of impedance versus frequency for a resonant tank circuit in accordance with an embodiment. As illustrated in graph 600 of FIG. 6, in both a low frequency band illustrated at curves 610 and in a high frequency band, illustrated at curves 620, a substantially steady maximum impedance may be realized by providing a programmable resistor in parallel with the additional components of a resonant tank circuit as described herein.

Still further, by using an embodiment having a programmable inductor, additional benefits may inhere by way of a reduced amount of "Ctune", i.e., Cvar,max, required to achieve the same frequency range coverage. For a conventional implementation, $$C_{var,max} = \left(\frac{1}{(2\pi f_{min})^2} - \frac{1}{(2\pi f_{max})^2}\right) \times \frac{1}{L_1}$$

while for an embodiment having a programmable inductor, for HB operation, $$C_{var,max,HB} = \left(\frac{1}{(2\pi f_{min2})^2} - \frac{1}{(2\pi f_{max})^2}\right) \times \frac{1}{L_1}$$

and for LB operation, $$C_{var,max,LB} = \left(\frac{1}{(2\pi f_{min})^2} - \frac{1}{(2\pi f_{max1})^2}\right) \times \frac{1}{L_{tot,LB}}$$

Assume some numbers for an example, $f_{max} = 2 \times f_{min}$ $f_{max1} = f_{min2} = \sqrt{2} \times f_{min}$ $L_2 = L_1, k_{12} = 0.9$ So, $L_{tot,LB} = L_1 + L_2 + 2 \times k_{12} \times \sqrt{L_1 \cdot L_2} = 3.8 \cdot L_1$ and for the conventional LC tuning tank, $$C_{var,max} = \left(\frac{1}{(2\pi f_{min})^2} - \frac{1}{(2\pi f_{max})^2}\right) \times \frac{1}{L_1} = \frac{3}{4} \times \frac{1}{(2\pi f_{min})^2} \times \frac{1}{L_1}$$

Instead with an embodiment, $$C_{var,max,HB} = \left(\frac{1}{(2\pi f_{min2})^2} - \frac{1}{(2\pi f_{max})^2}\right) \times \frac{1}{L_1} = \frac{1}{4} \times \frac{1}{(2\pi f_{min})^2} \times \frac{1}{L_1}$$

$$C_{var,max,LB} = \left(\frac{1}{(2\pi f_{min})^2} - \frac{1}{(2\pi f_{max1})^2}\right) \times \frac{1}{L_{tot,LB}} = \frac{1}{7.6} \times \frac{1}{(2\pi f_{min})^2} \times \frac{1}{L_1}$$

The final required "Cvar,max" is determined by the maximum value of "Cvar,max,HB" and "Cvar,max,LB", and in this particular example, it is only ⅓ of the requirement for the conventional solution. Using an embodiment having a reduced "Cvar,max" directly translates to savings of chip area, and indirectly saves current/power consumption.

As described herein, a programmable inductor accordance with an embodiment may be implemented on a single semiconductor die along with additional circuitry both of the resonant tank circuit and all other components of a given design. For example, an integrated circuit may include processing circuitry, RF circuitry, power circuitry and so forth, all of which may be implemented on a single semiconductor die along with a resonant tank including multiple inductors as described herein.

In one particular embodiment assume a programmable inductor formed of two different inductors. In this implementation, each inductor may be formed on a different conductive layer of the semiconductor die. For example, the programmable inductor can be implemented (area) efficiently by using a stacked inductor formed on multiple conductive layers of the semiconductor die. For instance, L1 can be implemented on a first metal layer (or multiple metal layers), and L2 can be implemented on a different second metal layer (or multiple metal layers). With this stacked inductor implementation, chip area is saved.

Figure 7:
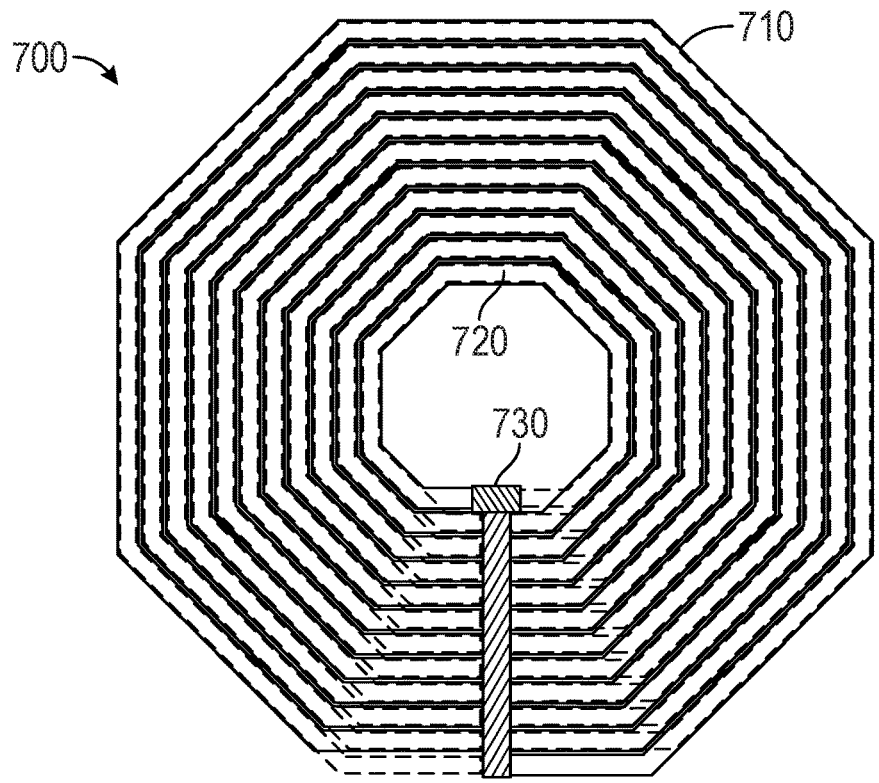
FIG. 7 is a high level view of a programmable inductor in accordance with an embodiment.

Referring now to FIG. 7, shown is a high level view of a programmable inductor in accordance with an embodiment. As shown in FIG. 7, programmable inductor 700 is implemented with two separate spiral inductors each formed on a different conductive layer of a semiconductor die. As shown in this example, a first metal layer is used to form a first spiral inductor 710 (e.g., L1), and a second metal layer is used to form another spiral inductor 720 (e.g., L2) on top of the first spiral inductor. The two inductors are connected in the center through via layers. A cross-over routing 730 is used to bring the center connection out and form a third port that couples L1 and L2. Note that each individual inductor is not limited to a spiral shape, and the third port is not limited to be at the connecting point of L1 and L2 as in this example.

Figure 8:
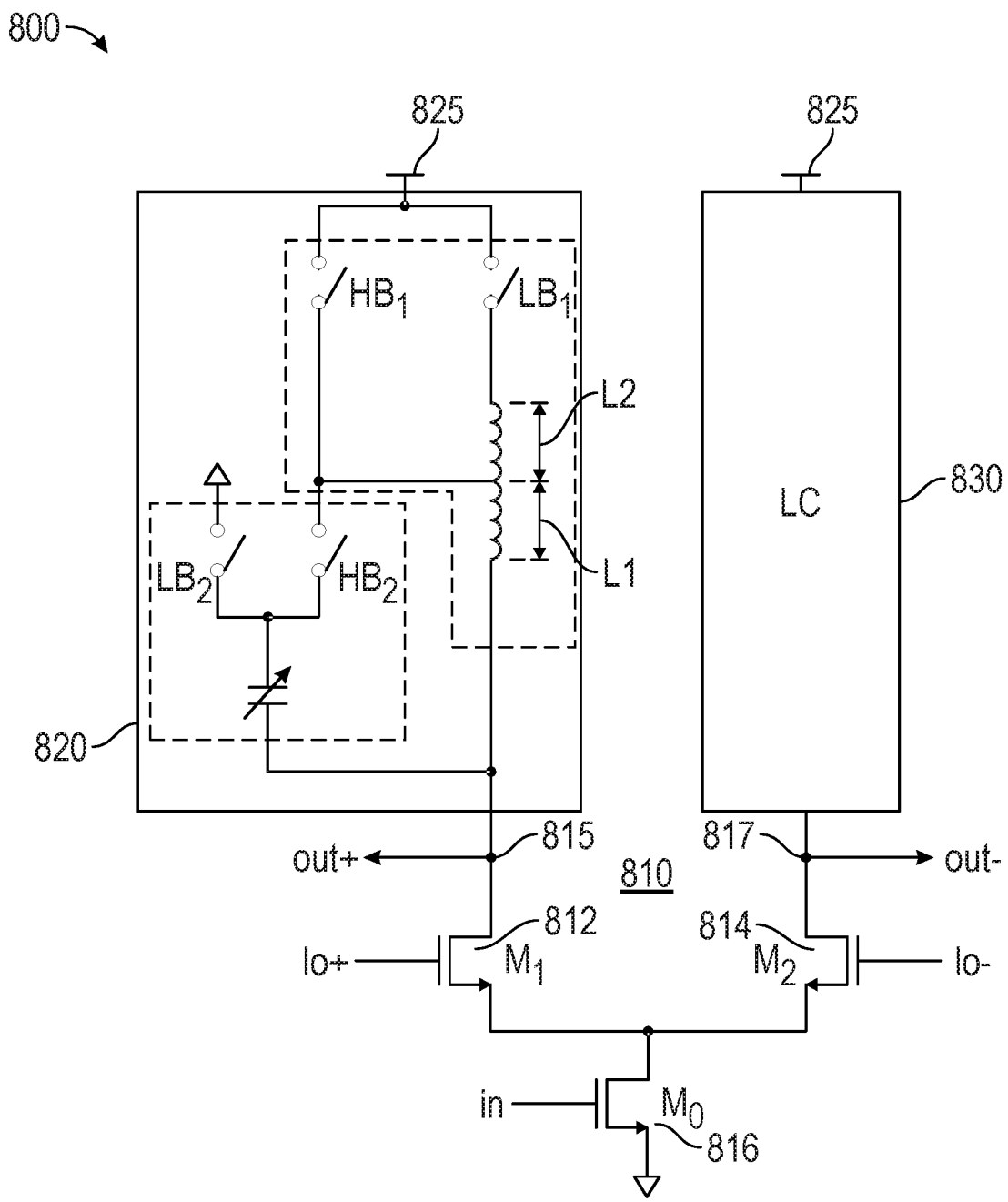
FIG. 8 is a schematic diagram of a circuit in accordance with an embodiment.

As said, one common usage of a tuned LC tank is as a loading component in radio frequency circuits, e.g., amplifier, filter, and mixer, etc., to provide gain and filtering at high frequency. One example is shown in FIG. 8, which is a schematic diagram of a circuit in accordance with another embodiment. As shown in FIG. 8, circuit 800 includes a mixer 810. In the high level shown in FIG. 8, mixer 810 is implemented as a single-balanced mixer. Of course other mixer implementations such as a double-balanced mixer are possible. In the embodiment shown, mixer 810 includes a differential amplifier formed of a pair of NMOS devices 812, 814. As seen, each NMOS device has a source terminal coupled to a drain terminal of another NMOS device 816 and drain terminals to provide corresponding output signals (out+/out−) at output nodes 815, 817.

In the embodiment shown, mixer 810 is implemented as an upconverting mixer, such that NMOS devices 812, 814 act as switching devices that have corresponding gate terminals coupled to receive clock signals (local oscillator signals Lo+/Lo−, which may be received from a frequency synthesizer or other frequency generator) and upconvert an incoming signal to a higher frequency. In a particular embodiment, the incoming signal (in) may be received at baseband frequency and is output at a higher, e.g., RF frequency. To realize such operation, NMOS device 816 has a gate terminal coupled to receive the input signal (in) and NMOS devices 812, 814 upconvert the signal to RF, using mixing signals (Lo+/Lo−).

Still with reference to FIG. 8, note that corresponding load circuits 820, 830 couple between outputs nodes 815, 817 and a supply voltage node 825. As illustrated in the high level of FIG. 8, each load circuit 820, 830 may be implemented as a tuning network having a programmable inductance as described herein. While FIG. 8 illustrates load circuit 820 having a configuration as in FIG. 4A or 4B, other variations are equally possible. Load circuit 830 may be similarly configured. Understand while shown at this high level in the embodiment of FIG. 8, many variations and alternatives are possible. For example, a tuning network having a programmable inductor as described herein may be used as a load circuit for other types of RF circuitry, including amplifiers, mixers, filters or so forth. As another example, instead of a mixer, load circuits 820, 830 may couple to an amplifier (e.g., a differential amplifier) that in turn couples to a biasing current source rather than NMOS device 816 as shown in FIG. 8. In such embodiment, an overall gain (over frequency) of the amplifier is given by:

$$G = g_m \cdot Z(s).$$

Since gm is determined by the biasing current, to reach same amount of gain, the higher the Z, the lower the gm, and thus the lower the current. With a programmable inductor (and potentially additional programmable resistance), embodiments may provide a load circuit having a higher impedance, enabling such amplifier to operate with reduced power consumption.

Figure 9:
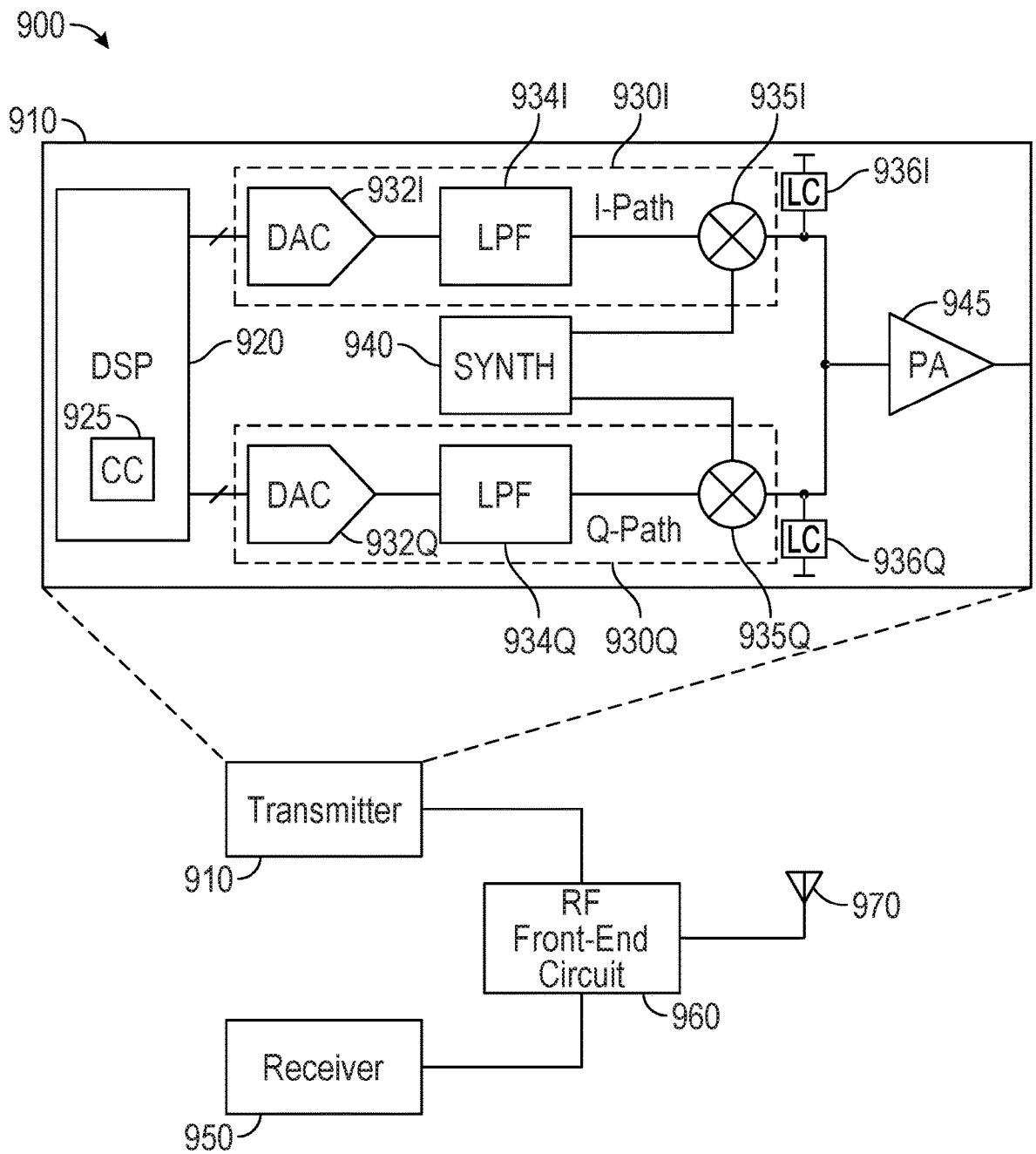
FIG. 9 is a block diagram of an integrated circuit in accordance with an embodiment.

Referring now to FIG. 9, shown is a block diagram of an integrated circuit in accordance with an embodiment. As shown in FIG. 9, integrated circuit 900 may be any type of circuit that provides a variety of functionality and further enables radio communication. In the high level view of FIG. 9, integrated circuit 900 may be implemented as one or more semiconductor dies that provide both transmit and receive capabilities. Thus as shown in high level, integrated circuit 900 may include a transmitter 910, a receiver 950, and an RF front end circuit 960, itself coupled to an antenna 970. In one embodiment, all circuitry other than antenna 970 may be on a single semiconductor die.

FIG. 9 illustrates the inclusion of representative LC circuits as described herein, Details of transmitter 910 are shown. As illustrated, transmitter 910 includes a digital signal processor (DSP) 920 that may perform various digital processing, e.g., for sensing, metering or actuating functionality, and provide corresponding digital signals to corresponding complex signal processing paths, namely an in-phase path 930I and a quadrature-phase path 930Q. Details of signal processing path 930I are described. As illustrated, incoming digital signals are converted into analog form in a digital-to-analog converter 932I. The corresponding analog signals are provided to a low pass filter 934I. In turn, resulting signals are provided to a mixer 935I, which upconverts the incoming signals, e.g., at an intermediate frequency to a radio frequency, via a mixing signal received from a synthesizer 940. As such, mixer 935I outputs RF signals. As shown, an LC circuit 936I, which may include a programmable inductor as described herein, access acts as a load circuit that is coupled to the output of mixer 935I. As shown, resulting RF signals may be output to a power amplifier 945, which amplifies the signals and outputs them from transmitter 910 to additional circuitry, e.g., within RF front end circuit 960.

As further shown in FIG. 9, DSP 920 may include or may be coupled to a control circuit 925. In embodiments herein, control circuit 925 may be configured, based at least in part on a desired resonant frequency, to programmably control LC circuits 936 to operate at that resonant frequency. To this end, control circuit 925 may send control signals (not shown for ease of illustration in FIG. 9) to LC circuits 936 to cause appropriate control of included switches within the circuits. For example, control circuit 925 may send control signals to control switches within a programmable inductor portion and a programmable capacitor portion of these LC circuits. Additional control signals may be provided, e.g., to control a controllable resistance in implementations including such resistances. Understand while shown at this high level in the embodiment of FIG. 9, many variations and alternatives are possible.

With embodiments, a programmable inductor may be provided to save area and/or power to cover operation over a wide frequency range. This programmable inductor may enhance performance (e.g., impedance/gain) at lower frequency and reduce variation over frequency range. Such programmable inductor may be implemented as a stacked inductor and corresponding switches. As described herein, the programmable inductor may enable use of a smaller tuning capacitance implementation. In turn, this tuning capacitance may be implemented in a manner to reduce the adverse impact of programming switch resistance. In some implementations, a variable resistor may be included and/or coupled to a resonant tank circuit to further reduce impedance variation over a frequency range.

Figure 10:
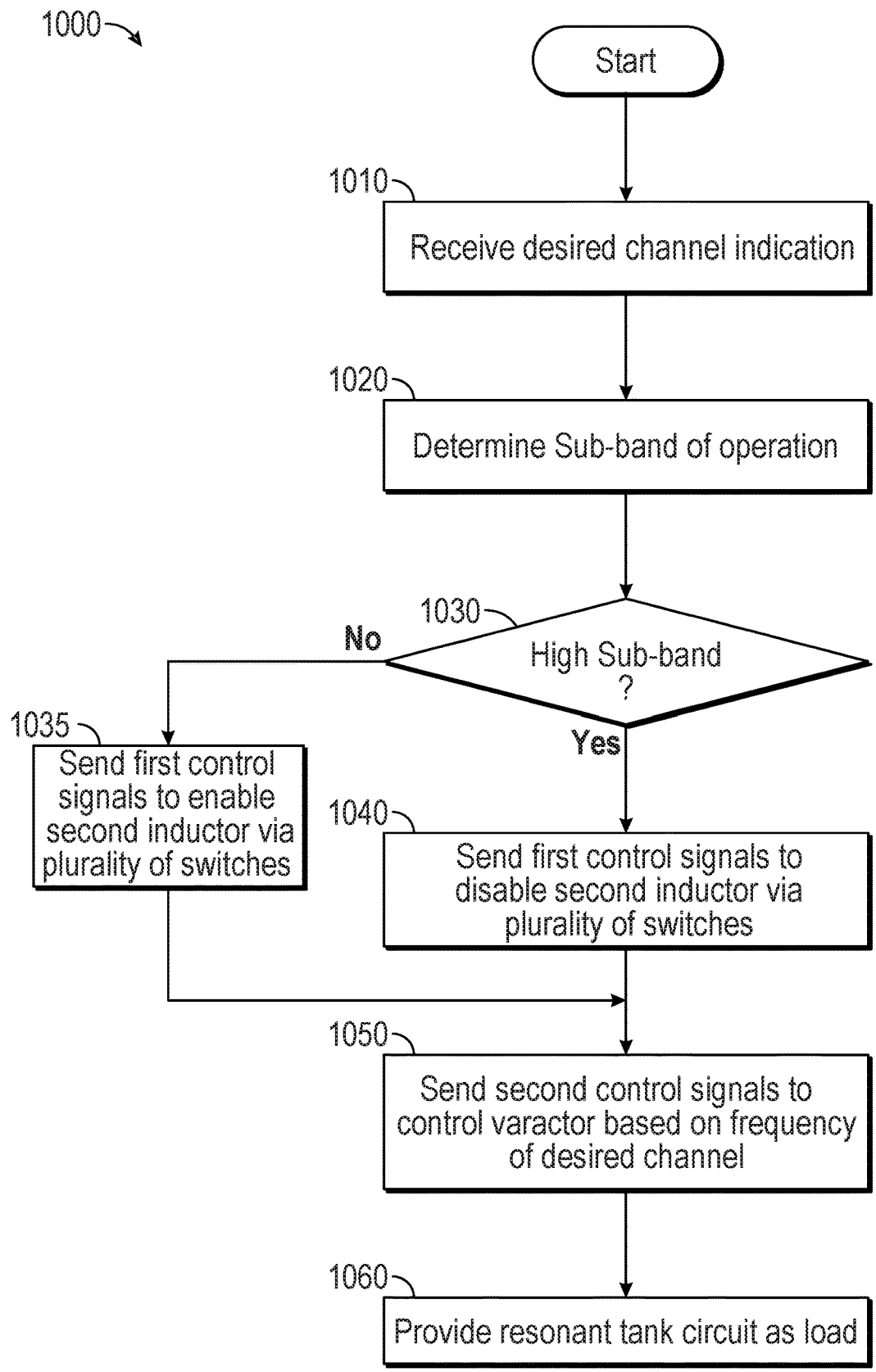
FIG. 10 is a flow diagram of a method in accordance with an embodiment.

Referring now to FIG. 10, shown is a flow diagram of a method in accordance with an embodiment. As shown in FIG. 10, method 1000 may be implemented by a control circuit of a radio or another controller of a system to control an LC tank as described herein. As such this control circuit which may be implemented as a hardware circuit and may execute instructions stored in a non-transitory storage medium. In the embodiment of FIG. 10 method 1000 may begin by receiving a desired channel indication (block 1010). For example, an MCU or other controller may receive an indication of a frequency for a channel requested by a user, which may be based on a wireless protocol to be used. From this, the MCU may determine a sub-band of operation (block 1020). Assume for purposes of discussion an implementation in which an LC tank to be controlled has two inductors such that a wider frequency range can be broken down into two bands, a low band and a high band. Of course additional sub-bands may be present in other embodiments.

Then control passes to diamond 1030 where it may be determined whether the determined sub-band is the high sub-band. If so, control passes to block 1040 where a first set of control signals may be sent to the LC tank to cause a second inductor to be disabled via a plurality of switches. For example, with reference to, e.g., FIG. 2, inductor L2 may be de-coupled from a resonant tank by appropriate control of switches 222, 224, to thus prevent this inductor from being part of the resonant tank circuit.

If instead the low sub-band is determined, control then passes to block 1035 where the first set of control signals may be sent to the LC tank to cause the second inductor to be enabled via the plurality of switches. Thus in this case the second inductor becomes part of the resonant tank circuit.

Note that in an implementation with more than two sub-bands, additional inductors may be present and controllably switched into or out of a resonant tank circuit depending on sub-band of operation.

Referring still to FIG. 10, to cause a resonant tank circuit to operate at a desired resonant frequency, control passes to block 1050 where a varactor may be set based on the frequency of the desired channel. That is, the controller may control the varactor, which can be a digitally controlled capacitor array, to provide a given amount of capacitance which, along with the selected amount of inductance, provides a resonant tank circuit to resonate at the desired resonant frequency. Finally, control passes to block 1060 where the resonant tank circuit is thus appropriately configured to be provided as a load for a given RF circuit. While shown with this particular implementation in the embodiment of FIG. 10, many variations and alternatives are possible. For example, additional control signals may be sent to switches associated with a programmable resistor in implementations further having such resistor coupled to the resonant tank circuit.

Figure 11:
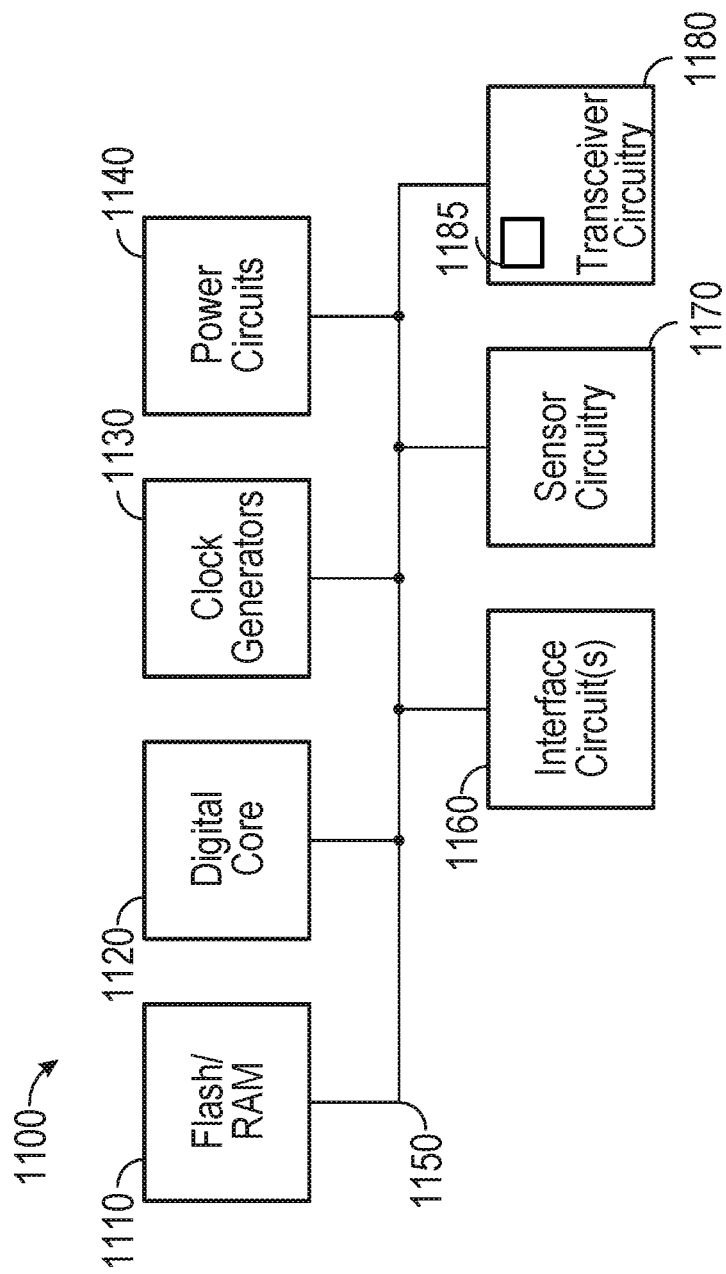
FIG. 11 is a block diagram of a representative integrated circuit in accordance with an embodiment.

Referring now to FIG. 11, shown is a block diagram of a representative integrated circuit 1100 which may include a controllable tuning network having a programmable inductor, programmable capacitor and, optionally, a programmable resistor as described herein. In the embodiment shown in FIG. 11, integrated circuit 1100 may be, e.g., a microcontroller, wireless transceiver or other device that can be used in a variety of use cases, including sensing, metering, monitoring, embedded applications, communications, applications and so forth, and which may be particularly adapted for use in an Internet of Things (IoT) device.

In the embodiment shown, integrated circuit 1100 includes a memory system 1110 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions for controlling operation of one or more tuning networks to resonate at a desired resonant frequency, e.g., depending on frequency of operation as described herein.

Memory system 1110 couples via a bus 1150 to a digital core 1120, which may include one or more cores and/or microcontrollers that act as a main processing unit of the integrated circuit. In turn, digital core 1120 may couple to clock generators 1130 which may provide one or more phase locked loops or other clock generation circuitry to generate various clocks for use by circuitry of the IC.

As further illustrated, IC 1100 further includes power circuitry 1140, which may include one or more voltage regulators. Additional circuitry may optionally be present depending on particular implementation to provide various functionality and interaction with external devices. Such circuitry may include interface circuitry 1160 which may provide interface with various off-chip devices, sensor circuitry 1170 which may include various on-chip sensors including digital and analog sensors to sense desired signals, such as for a metering application or so forth.

In addition as shown in FIG. 11, transceiver circuitry 1180 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. To this end, transceiver circuitry 1180 may include load circuitry 1185 including one or more tuning networks as described herein. Understand while shown with this high level view, many variations and alternatives are possible.

Note that transceivers such as described herein may be implemented in a variety of different devices. In one implementation, a transceiver having one or more tuning networks as described herein may be used in an IoT device. This IoT device may be a smart utility meter for use in a smart utility network, e.g., a mesh network in which communication is according to an IEEE 802.15.4 specification.

Figure 12:
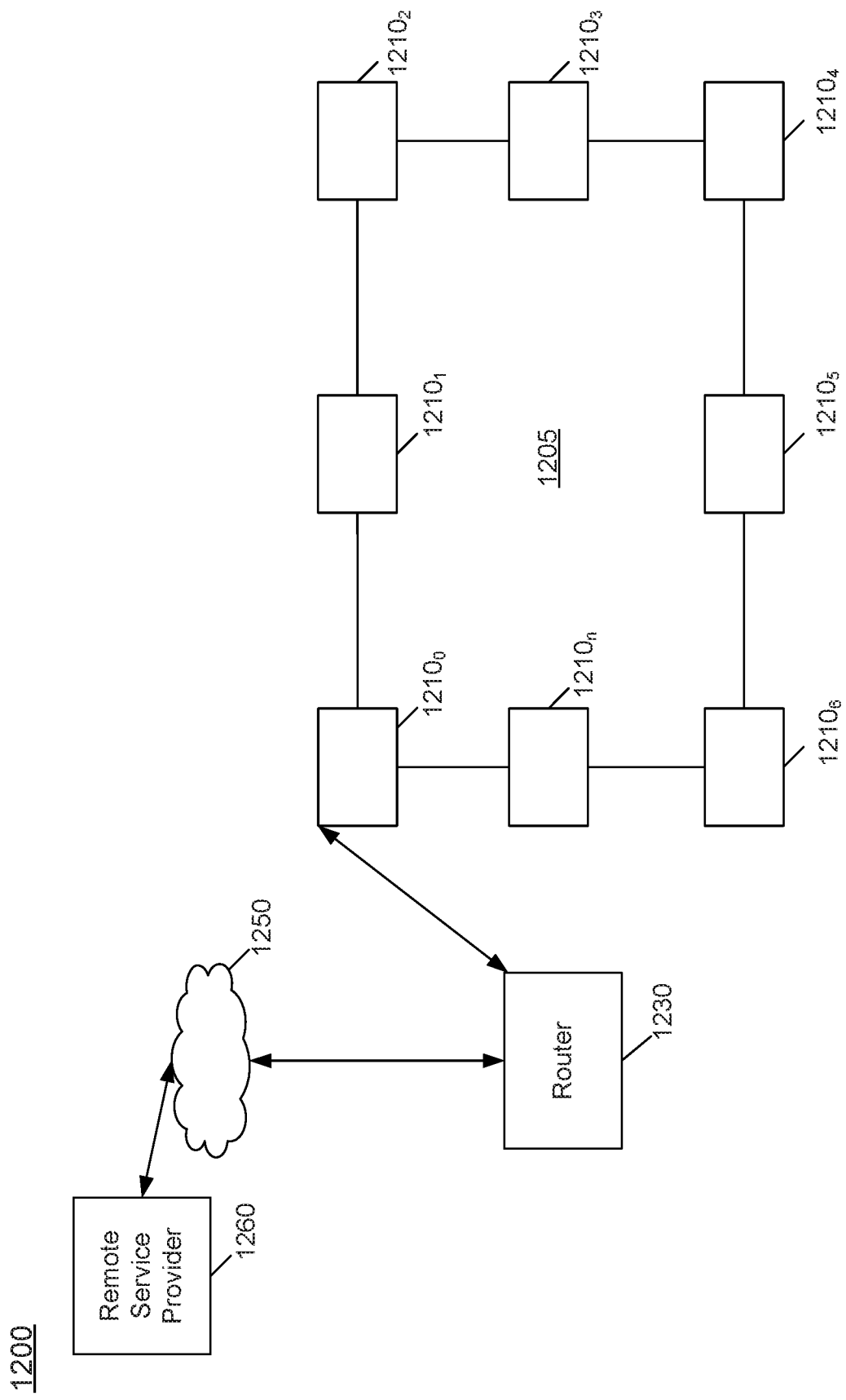
FIG. 12 is a high level diagram of a network in accordance with an embodiment.

Referring now to FIG. 12, shown is a high level diagram of a network in accordance with an embodiment. As shown in FIG. 12, a network 1200 includes a variety of devices, including smart devices such as IoT devices, routers and remote service providers. In the embodiment of FIG. 12, a mesh network 1205 may be present, e.g., in a neighborhood having multiple IoT devices 12100_. Such IoT devices may include one or more tuning networks as described herein. As shown, at least one IoT device 1210 couples to a router 1230 that in turn communicates with a remote service provider 1260 via a wide area network 1250, e.g., the Internet. In an embodiment, remote service provider 1260 may be a back-end server of a utility that handles communication with IoT devices 1210. Understand while shown at this high level in the embodiment of FIG. 12, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
    a tuning network comprising:
        a controllable capacitance;
        a first switch coupled between the controllable capacitance and a reference voltage node;
        a second switch coupled between the controllable capacitance and a third switch;
        the third switch coupled between the second switch and a second voltage node;
        a fourth switch coupled between the second voltage node and a first inductor;
        the first inductor having a first terminal coupled to the fourth switch and a second terminal coupled to at least the second switch; and
        a second inductor having a first terminal coupled to the second terminal of the first inductor and a second terminal coupled to the controllable capacitance.

2. The integrated circuit of claim 1, further comprising a control circuit to selectively control the first switch, the second switch, the third switch and the fourth switch to cause the tuning network to operate at a desired resonant frequency.

3. The integrated circuit of claim 2, wherein the control circuit is to control the tuning network to:
    operate in a first sub-range of a frequency range, via a parallel coupling of the second inductor to the controllable capacitance and a decoupling of the first inductor; and
    operate in a second sub-range of the frequency range, via a parallel coupling of the first inductor, the second inductor and the controllable capacitance.

4. The integrated circuit of claim 3, wherein the second sub-range comprises a second frequency sub-band between a minimum frequency and a first maximum frequency and the first sub-range comprises a first frequency sub-band between a second minimum frequency greater than the minimum frequency and a maximum frequency.

5. The integrated circuit of claim 1, further comprising a programmable resistor coupled to the tuning network.

6. The integrated circuit of claim 5, wherein the programmable resistor is to reduce an impedance variation of the tuning network over a frequency range.

7. The integrated circuit of claim 1, wherein the first inductor is formed on a first conductive layer of a semiconductor die and the second inductor is formed on a second conductive layer of the semiconductor die, and wherein the first inductor is coupled to the second inductor through at least one via layer.

8. The integrated circuit of claim 1, further comprising a mixer coupled to the tuning network, wherein the tuning network comprises a load circuit for the mixer.

9. An apparatus comprising:
a programmable capacitance;
a programmable inductance coupled to the programmable capacitance;
a first switch to couple a maximum value of the programmable inductance to the programmable capacitance in a first mode of operation;
a second switch to couple a lesser value of the programmable inductance to the programmable capacitance in a second mode of operation;
a third switch coupled between the controllable capacitance and a reference voltage node; and
a fourth switch coupled between the controllable capacitance and the second switch.

10. The apparatus of claim 9, wherein the programmable inductance comprises a first inductor and a second inductor coupled to the first inductor.

11. The apparatus of claim 10, wherein in the second mode of operation, the programmable capacitance is coupled in parallel with the first inductor.

12. The apparatus of claim 10, wherein in the first mode of operation, the programmable capacitance is coupled in parallel with the first inductor and the second inductor.

13. The apparatus of claim 9, further comprising a control circuit to selectively control the first switch, the second switch, the third switch and the fourth switch to cause the apparatus to operate at a desired resonant frequency.

14. The apparatus of claim 9, wherein the control circuit:
in the first mode of operation, is to control the first switch and the third switch to couple the maximum value of the programmable inductance in parallel with the programmable capacitance; and
in the second mode of operation, is to control the second switch and the fourth switch to couple the lesser value of the programmable inductance in parallel with the programmable capacitance.

15. The apparatus of claim 9, wherein in the second mode of operation, an on resistance of the second switch is outside of a resonant tank formed of the programmable capacitance and the programmable inductance.

16. The apparatus of claim 9, wherein a quality factor of the maximum value of the programmable inductance exceeds a quality factor of the first inductor and a quality factor of the second inductor.

17. A method comprising:
receiving, in a radio device, a desired channel indication at which the radio device is to operate;
determining a sub-band of operation in which the desired channel is located, the sub-band having a frequency range less than a total frequency range of the radio device;
responsive to determining the sub-band of operation is a first sub-band of operation extending from a minimum frequency of the total frequency range to a first maximum frequency less than a maximum frequency of the total frequency range, coupling, via at least a first switch and a second switch, a maximum value of a programmable inductance to a programmable capacitance to form a resonant tank circuit, the first switch coupled between the programmable inductance and a first voltage node, the second switch coupled between the first voltage node and a third switch, the third switch coupled between the second switch and the programmable capacitance, and a fourth switch coupled between the programmable capacitance and a reference voltage node, to cause the resonant tank circuit to operate having a resonant frequency within the first sub-band of operation; and
providing the resonant tank circuit as a load for at least one radio frequency circuit.

18. The method of claim 17, further comprising:
responsive to determining the sub-band of operation is a second sub-band of operation extending to the maximum frequency of the total frequency range, coupling, via at least the first switch and the second switch, a lesser value of the programmable inductance to the programmable capacitance to form the resonant tank circuit; and
providing the resonant tank circuit as the load for the at least one radio frequency circuit, the resonant tank circuit having a resonant frequency within the second sub-band of operation.

* * * * *